US010290996B1

(12) United States Patent
Mathai et al.

(10) Patent No.: US 10,290,996 B1
(45) Date of Patent: May 14, 2019

(54) BOTTOM EMITTING VERTICAL-CAVITY SURFACE-EMITTING LASERS

(71) Applicant: HEWLETT PACKARD ENTERPRISE DEVELOPMENT LP, Palo Alto, CA (US)

(72) Inventors: Sagi Varghese Mathai, Sunnyvale, CA (US); Stanley Cheung, Palo Alto, CA (US); Wayne V. Sorin, Mountain View, CA (US); Michael Renne Ty Tan, Menlo Park, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/962,649

(22) Filed: Apr. 25, 2018

(51) Int. Cl.
*H01S 5/00* (2006.01)
*H01S 5/183* (2006.01)
(Continued)

(52) U.S. Cl.
CPC ........ *H01S 5/18305* (2013.01); *H01S 5/0224* (2013.01); *H01S 5/183* (2013.01);
(Continued)

(58) Field of Classification Search
CPC ............. H01S 5/19305; H01S 5/18308; H01S 5/18369; H01S 5/18375; H01S 5/18377;
(Continued)

(56) References Cited

U.S. PATENT DOCUMENTS

2012/0128019 A1\* 5/2012 Chang-Hasnain ........................... H01S 5/18386
372/45.01
2017/0214218 A1\* 7/2017 Tan ........................ H01S 5/0224
(Continued)

FOREIGN PATENT DOCUMENTS

WO WO-2010138524 12/2010

OTHER PUBLICATIONS

20 Gb_s Modulation of Silicon-Integrated Short-Wavelength Hybrid-Cavity VCSELs [via Google], Apr. 15, 2016.
(Continued)

*Primary Examiner* — Kinam Park
(74) *Attorney, Agent, or Firm* — Nolte Intellectual Property Law Group

(57) ABSTRACT

A bottom-emitting vertical-cavity surface-emitting laser (VCSEL) structure includes a first substrate permitting the passage of light therethrough, an n-doped distributed Bragg reflector (nDBR), a p-doped distributed Bragg reflector (pDBR), one or more active layers, at least one of a high contrast grating mirror and a dielectric-enhanced metal mirror, and a plurality of layers, where the VCSEL structure is configured to be flip chipped to a second substrate. The pDBR and the nDBR define a laser cavity extending vertically therebetween and containing the one or more active layers. The at least one of a high contrast grating mirror and a dielectric-enhanced metal mirror may be disposed over the pDBR. The plurality of layers may be disposed over the at least one of the high contrast grating mirror and the dielectric-enhanced metal mirror to optically and hermetically seal the laser cavity.

20 Claims, 2 Drawing Sheets

(51) Int. Cl.
  *H01S 5/187* (2006.01)
  *H01S 5/022* (2006.01)
  *H01S 5/024* (2006.01)
(52) U.S. Cl.
  CPC .......... *H01S 5/187* (2013.01); *H01S 5/18308* (2013.01); *H01S 5/18311* (2013.01); *H01S 5/18369* (2013.01); *H01S 5/18375* (2013.01); *H01S 5/18388* (2013.01); *H01S 5/02476* (2013.01)
(58) Field of Classification Search
  CPC .... H01S 5/18388; H01S 5/0224; H01S 5/187; H01S 5/02476; H01S 5/18311
  See application file for complete search history.

(56) References Cited

U.S. PATENT DOCUMENTS

2017/0256915 A1*  9/2017  Ghosh .................. H01S 5/0421
2018/0175587 A1*  6/2018  Mathai .................. H01S 5/068

OTHER PUBLICATIONS

Fabrication, Simulation, and Cascading of Electrically Pumped Vertical External Cavity Surface Emitting Lasers (EP-VECSELs) [via Google], Jun. 2016.
High Reflectivity Subwavelength Metal Grating for VCSEL [via IEEE], May 2011.

* cited by examiner

US 10,290,996 B1

BOTTOM EMITTING VERTICAL-CAVITY SURFACE-EMITTING LASERS

STATEMENT OF GOVERNMENT INTEREST

This invention was made with government support under Government Prime Contract No. DE-AC52-07NA27344 awarded by the U.S. Department of Energy. The government has certain rights in the invention.

BACKGROUND

Lasers are widely used in a variety of commercial and research applications. There are several types of lasers in use including, for example, gas lasers, solid-state lasers, free electron lasers, and semiconductor lasers. Semiconductor lasers are generally fabricated on polished semiconductor wafers with lithographic techniques and include an active region disposed in a cavity formed between top and bottom mirrors. In operation, the active region may be pumped (e.g., electrically or optically) with a pumping energy to produce photons, some of which resonate and build up to form coherent light in the cavity. A portion of the coherent light resonating in the cavity may pass through one of the mirrors (exit mirror) as a laser beam. The exit mirror generally has slightly lower reflectance (i.e., reflectivity) than the other mirror.

Semiconductor lasers may be edge-emitting semiconductor lasers or surface-emitting semiconductor lasers. Edge-emitting semiconductor lasers may output the laser beam in a direction parallel to the wafer surface, whereas the surface-emitting semiconductor lasers output the laser beam in a direction perpendicular to the wafer surface. Generally, surface-emitting layers may emit light more efficiently than edge-emitting lasers and may also be arranged in two-dimensional, light-emitting arrays.

One type of surface-emitting semiconductor laser is the vertical-cavity surface-emitting laser (VCSEL). In a VCSEL, the term "vertical" is the direction perpendicular to the plane of the substrate on which the constituent layers are deposited or epitaxially grown, with "up" being typically defined as the direction of epitaxial growth. VCSELs may be configured as top-emitting or bottom-emitting. In a top-emitting configuration, the output laser beam is emitted out of the top side of the VCSEL, in which case the top mirror is the exit mirror. Conversely, in a bottom-emitting VCSEL, the laser beam is emitted from the bottom side of the VCSEL, in which case the bottom mirror is the exit mirror.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
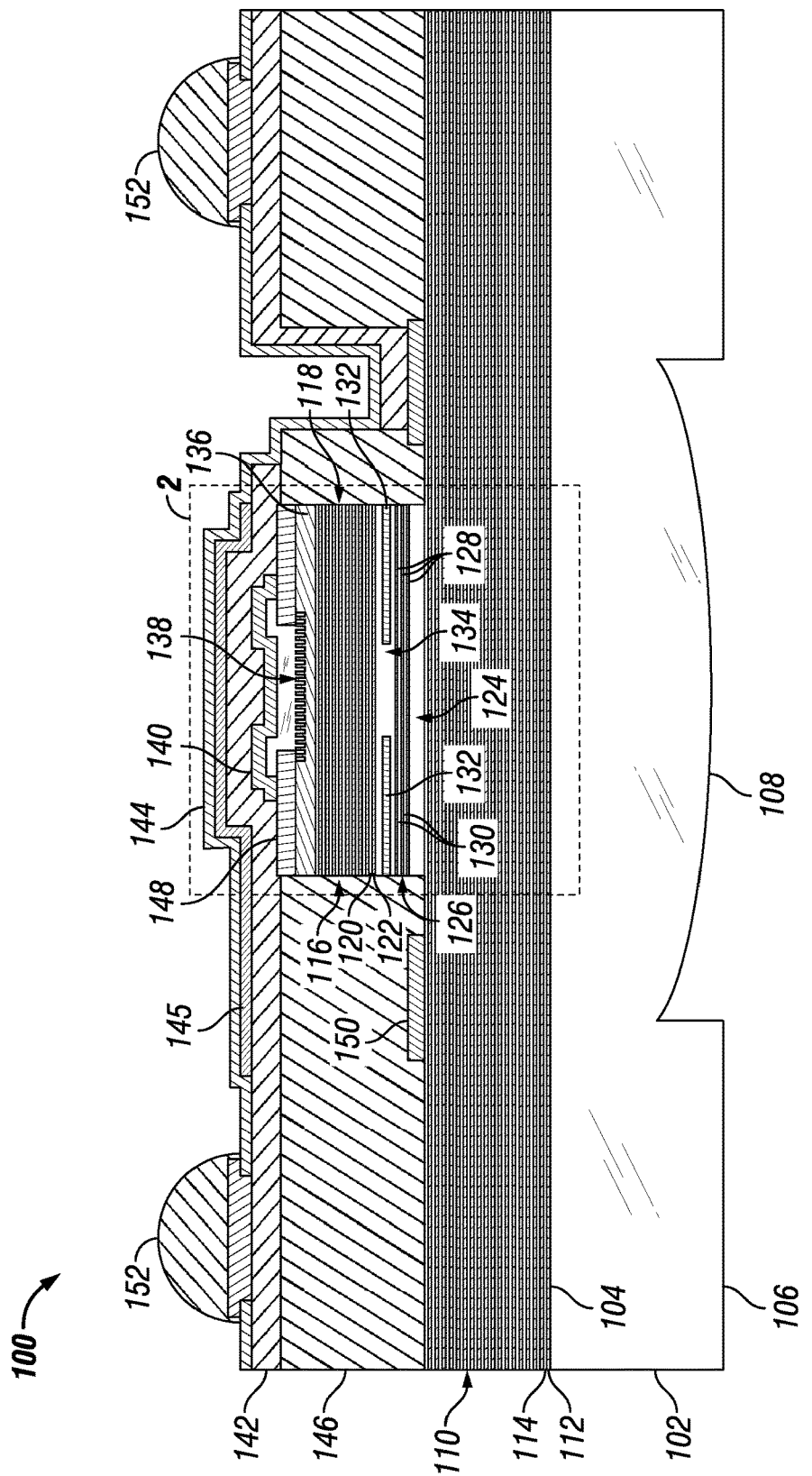
FIG. 1 illustrates a cross sectional view of a bottom-emitting vertical-cavity surface-emitting laser structure including a substrate, according to one or more embodiments of the disclosure.

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Embodiments of the present disclosure are directed to a bottom-emitting vertical-cavity surface-emitting laser (VCSEL) structure including a substrate (e.g., supporting substrate) and capable of being flip chipped to another substrate (e.g., organic substrate) similar to an integrated circuit. The VCSEL structure may include a top mirror portion and a bottom mirror portion, where the top mirror portion and the bottom mirror portion define a laser cavity extending vertically therebetween. The top mirror portion includes a p-doped distributed Bragg reflector (pDBR) and the bottom mirror portion is or includes an n-doped distributed Bragg reflector (nDBR). The VCSEL structure includes an active region disposed in the laser cavity and electrically coupled to a pumping source. In at least one embodiment, the pumping source may electrically pump current to the active region to generate light that may be resonated in the laser cavity between the top mirror portion and the bottom mirror portion to form a coherent light, which is output as a laser beam through a lens defined in the supporting substrate.

To improve reflectivity of the top mirror portion and manufacturing quality, and to reduce manufacturing costs and complexity, a portion of the pDBR (e.g., at least fifty percent of the semiconductor layers thereof) may be replaced with a high contrast grating mirror, a dielectric-enhanced metal mirror, or both a high contrast grating mirror and a dielectric-enhanced metal mirror. Additionally, at least one insulating layer may be disposed over the high contrast grating mirror, the dielectric-enhanced metal mirror, or both the high contrast grating mirror and the dielectric-enhanced metal mirror to hermetically and optically seal the laser cavity from an environment external of the VCSEL structure.

Particularly, in one embodiment of the present disclosure, a bottom-emitting vertical-cavity surface-emitting laser (VCSEL) structure includes: a first substrate permitting the passage of light therethrough; an n-doped distributed Bragg reflector (nDBR); a p-doped distributed Bragg reflector (pDBR); one or more active layers; at least one of a high contrast grating mirror and a dielectric-enhanced metal mirror; and a third plurality of layers, where the VCSEL structure is configured to be flip chipped to a second substrate. The n-doped distributed Bragg reflector (nDBR) may be disposed on the first substrate and includes a first plurality of layers of semiconductor material. The p-doped distributed Bragg reflector (pDBR) may include a second plurality of layers of semiconductor material, and the pDBR and the nDBR may define a laser cavity extending vertically therebetween. The one or more active layers may be disposed in the laser cavity between the nDBR and the pDBR. The at least one of the high contrast grating mirror and the dielectric-enhanced metal mirror may be disposed over the pDBR. The third plurality of layers may be disposed over the at least one of the high contrast grating mirror and the dielectric-enhanced metal mirror. The third plurality of layers may include a trace layer, an insulating layer, and a thermal conducting layer disposed between the trace layer and the insulating layer. Each of the third plurality of layers configured to optically and hermetically seal the laser cavity from an environment external of the bottom-emitting VCSEL structure.

In another embodiment of the present disclosure, a bottom-emitting vertical-cavity surface-emitting laser (VCSEL) structure includes: a first substrate permitting the passage of light therethrough; a first mirror portion; a second mirror portion; an active region; a third plurality of layers; and a polyimide layer, where the VCSEL structure is configured to be flip chipped to a second substrate. The first mirror portion may be disposed on the first substrate and includes a first plurality of layers of semiconductor material. The second mirror portion may include a second plurality of layers of semiconductor material. The first mirror portion and the second mirror portion may define a cavity extending vertically therebetween. The second mirror portion may further include an oxidized layer and at least one of a high contrast grating mirror and a dielectric-enhanced metal mirror. The oxidized layer may define an oxide aperture to contain a current flowing therethrough, and the at least one of the high contrast grating mirror and the dielectric-enhanced metal mirror may be disposed over the oxidized layer. The active region may be disposed within the cavity, and the third plurality of layers may be disposed over the second mirror portion to optically and hermetically seal the cavity from an environment external of the bottom-emitting VCSEL structure. The polyimide layer may surround the second mirror portion and couple one or more layers of the third plurality of layers, the first mirror portion, and the second mirror portion.

In another embodiment of the present disclosure, a bottom-emitting vertical-cavity surface-emitting laser (VCSEL) structure includes: a first substrate permitting the passage of light therethrough; an n-doped distributed Bragg reflector (nDBR); a p-doped distributed Bragg reflector (pDBR); one or more active layers; an oxidized layer; a current spreading layer; at least one of a high contrast grating mirror and a dielectric-enhanced metal mirror; a third plurality of layers; a plurality of contact rings; and a plurality of solder bumps. The n-doped distributed Bragg reflector (nDBR) may be disposed on the first substrate and includes a first plurality of layers of semiconductor material. The p-doped distributed Bragg reflector (pDBR) may include a second plurality of layers of semiconductor material, and the pDBR and the nDBR may define a laser cavity extending vertically therebetween. The one or more active layers may be disposed in the laser cavity between the nDBR and the pDBR. The oxidized layer may be disposed over the one or more active layers and define an oxide aperture to contain a current flowing therethrough. The current spreading layer may be disposed over the pDBR. The at least one of the high contrast grating mirror and the dielectric-enhanced metal mirror may be disposed over the current spreading layer. The third plurality of layers may be disposed over the at least one of the high contrast grating mirror and the dielectric-enhanced metal mirror to optically and hermetically seal the laser cavity from an environment external of the bottom-emitting VCSEL structure. The plurality of contact rings may electrically couple a trace layer of the third plurality of layers with the pDBR and the nDBR. The plurality of solder bumps may be disposed on each of the trace layer and an insulating layer of the third plurality of layers to flip chip and electrically couple the bottom-emitting VCSEL structure to a second substrate.

In the present disclosure, the terms "top" and "bottom" are employed for orientation purposes, to indicate the axial position of a layer or grouping of layers, relative to the active region. For example, the term "bottom" denotes a layer or grouping of layers that is (or will be) between the active region and the supporting substrate, and the term "top" denotes a layer or grouping of layers on the other side of the active region.

Figure 2:
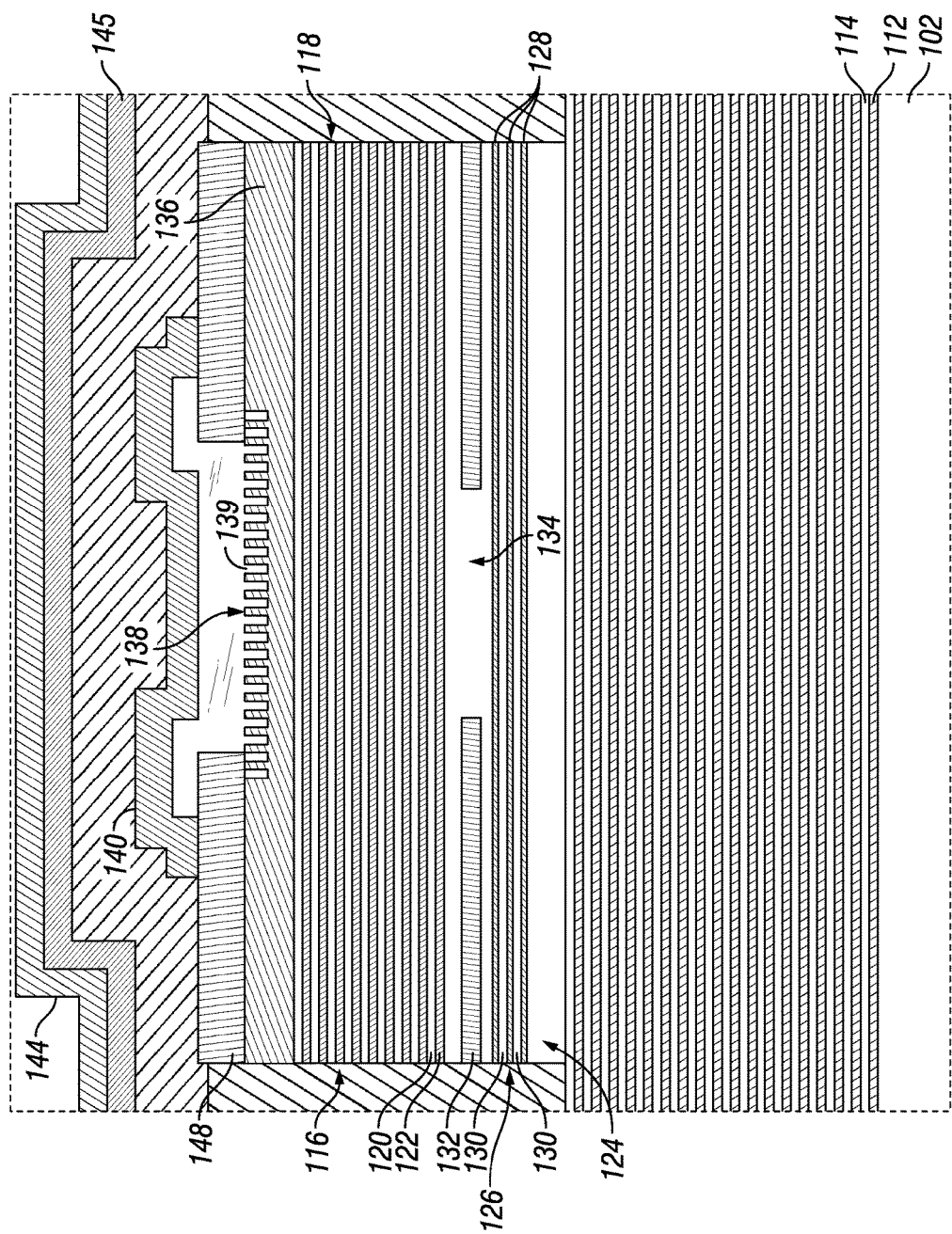
FIG. 2 illustrates an enlarged view of the portion of the bottom-emitting vertical-cavity surface-emitting laser structure indicated by the box labeled 2 of FIG. 1, according to one or more embodiments of the disclosure.

Turning now to the Figures, FIG. 1 illustrates a cross sectional view of a bottom-emitting vertical-cavity surface-emitting laser (VCSEL) structure 100 including a substrate 102, according to one or more embodiments of the disclosure. FIG. 2 illustrates an enlarged view of the portion of the VCSEL structure 100 indicated by the box labeled 2 of FIG. 1, according to one or more embodiments of the disclosure. Portions of the VCSEL structure 100 may be epitaxially grown as a layer structure on the substrate 102. In particular, portions of the VCSEL structure 100 may be epitaxially grown utilizing techniques such as, for example, molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. In other embodiments, one or more layers may be deposited with non-epitaxial deposition techniques such as e-beam evaporation, thermal evaporation, or sputtering.

In the example embodiment of FIGS. 1 and 2, the substrate 102 permits coherent light to pass therethrough and is formed from gallium arsenide (GaAs); however, the present disclosure is not limited thereto, and other suitable substrates 102 may be constructed from materials, such as, for example, silicon, silicon dioxide, aluminum oxide, sapphire, an alloy of silicon and germanium, and indium phosphide (InP). The substrate 102 may have a planar top surface 104 on which the VCSEL structure 100 is grown, and a bottom surface 106. A portion of the bottom surface 106 may be etched to form a lens 108 through which the coherent light may be output. In one or more embodiments, the lens 108 may be coated with an antireflective coating (not shown). In another embodiment, the lens 108 may be formed in a glass lens chip separate from the VCSEL structure 100.

The VCSEL structure 100 may include a bottom mirror portion 110 attached to and disposed on the top surface 104 of the substrate 102. In the example embodiment of FIGS. 1 and 2, the bottom mirror portion 110 is an n-doped distributed Bragg reflector (nDBR) having a plurality of layers 112, 114 (only one of each indicated) of semiconductor material functioning as a mirror for reflecting light. The plurality of layers 112, 114 may be arranged as multiple pairs of layers 112, 114 within the nDBR 110. For example, as illustrated in FIGS. 1 and 2, each pair includes a layer 112 and a layer 114. The layers 112 and 114 may be arranged in an alternating sequence within the nDBR 110.

In the example embodiment, each of the layers 112, 114 is formed from aluminum gallium arsenide (AlGaAs). The layers 112 may be constructed to have a different refractive index from the layers 114. The nDBR reflectivity and bandwidth depend on the refractive-index contrast of constituent materials of each layer 112, 114 and on the thickness of each layer 112, 114. To that end, the layers 112 may have a different aluminum concentration than the aluminum concentration in the layers 114. For example, each layer 112 may include a ninety percent aluminum concentration, and each layer 114 may include a ten percent aluminum concentration.

Accordingly, the layers 112 and 114 may have comparatively different refractive indices, such that the layer 112 may have a comparatively higher refractive index and the layer 114 may have a comparatively lower refractive index. For example, layers 112 may have an approximate refractive index of 3.5, and layers 114 may have an approximate refractive index of 3.3. Although each of the layers 112, 114 is formed from aluminum gallium arsenide (AlGaAs) in the illustrated embodiment, the present disclosure is not limited thereto, and the layers 112, 114 may be constructed from other suitable materials easily lattice matched with other components of the VCSEL structure 100 to permit epitaxial fabrication techniques.

The VCSEL structure 100 may further include a top mirror portion 116 disposed over the nDBR 110. In the example embodiment of FIGS. 1 and 2, the top mirror portion 116 includes a p-doped distributed Bragg reflector (pDBR) 118 having a plurality of layers 120, 122 (only one of each indicated) of semiconductor material functioning as a mirror for reflecting light. The plurality of layers 120, 122 may be arranged as pairs of layers 120, 122 within the pDBR 118. For example, as illustrated in FIGS. 1 and 2, each pair includes a layer 120 and a layer 122. The layers 120 and 122 may be arranged in an alternating sequence within the pDBR 118.

In the example embodiment, each of the layers 120, 122 is formed from aluminum gallium arsenide (AlGaAs). The layers 120 may be constructed to have a different refractive index from the layers 122. The pDBR reflectivity and bandwidth depend on the refractive-index contrast of constituent materials of each layer 120, 122 and on the thickness of each layer 120, 122. To that end, the layers 120 may have a different aluminum concentration than the aluminum concentration in the layers 122. For example, each layer 120 may include a ninety percent aluminum concentration, and each layer 122 may include a ten percent aluminum concentration.

Accordingly, the layers 120, 122 may have comparatively different refractive indices, such that the layer 120 may have a comparatively higher refractive index and the layer 122 may have a comparatively lower refractive index. For example, layers 120 may have an approximate refractive index of 3.5, and layers 122 may have an approximate refractive index of 3.3. Although each of the layers 120, 122 is formed from aluminum gallium arsenide (AlGaAs) in the example embodiment, the present disclosure is not limited thereto, and the layers 120, 122 may be constructed from other suitable materials easily lattice matched with other components of the VCSEL 100 to permit epitaxial fabrication techniques.

As shown in FIGS. 1 and 2, the pDBR 118 and the nDBR 110 define a laser cavity 124 extending vertically therebetween. The laser cavity 124 may also include separate confinement heterostructure layers above and below the active region 126. The VCSEL 100 may further include an active region 126 disposed in the laser cavity 124 between the pDBR 118 and the nDBR 110. The active region 126 may include one or more active layers 128 formed from gain media. In the example embodiment, the active region 126 may be constructed from multiple layers (three shown 128) of multiple quantum well (MQW) gain media; however, embodiments are not intended to be limited to the active region 126 having three active layers 128. In other embodiments, the active region 126 can have one, two, or more than three active layers 128.

In the example embodiment of FIGS. 1 and 2, the MQW gain media may be constructed from indium gallium arsenide and indium gallium phosphide. Other example materials from which the MQW gain media may be constructed include, but are not limited to, indium gallium arsenide and aluminum gallium arsenide, and gallium arsenide and aluminum gallium arsenide. As illustrated in FIGS. 1 and 2, adjacent active layers 128 may be separated by a barrier layer 130 (two shown). In one or more embodiments, each of the barrier layers 130 may be constructed from gallium arsenide.

The top mirror portion 116 may include an oxidized layer 132 disposed over and adjacent the active region 126 in the laser cavity 124 and defining an oxide aperture 134 to form an insulating region to contain a current flowing therethrough. In at least one other embodiment, the top mirror portion 116 may include two or more oxidized layers 132. In the example embodiment of FIGS. 1 and 2, the oxidized layer 132 is constructed from an aluminum gallium arsenide layer.

The oxidized layer 132 may be constructed from a partial oxidation of one of the layers 120 of the pDBR 118 constructed from aluminum gallium arsenide and having a relatively higher aluminum concentration (e.g., ninety percent aluminum concentration) than the other layer 122. The partial oxidation of the aluminum gallium arsenide layer results in the formation of at least a partial aluminum oxide layer. The diameter of the oxide aperture 134 may be dependent on the factors, such as, for example, a desired threshold current, differential efficiency, temperature performance, and speed. The oxidized layer 132 is non-conductive. Accordingly, the current pumped into the VCSEL structure 100 from the pumping source (e.g., voltage source) is funneled through the oxide aperture 134 and into the active region 126 in the laser cavity 124. In addition, the oxidized layer 132 confines the generated light in the lateral direction to the region within the oxide aperture 134.

The top mirror portion 116 may include a current spreading layer 136 disposed over the pDBR 118. The current spreading layer 136 may be a relatively thick layer (e.g., 0.5 microns) in comparison to the layers 120, 122 of the pDBR 118 and may be constructed from heavily p-doped gallium arsenide and configured to inject current uniformly across the laser cavity 124. The current spreading layer 136 further reduces lateral resistance and provides for thermal conductivity. In the example embodiment, the current spreading layer 136 has a negligible impact on reflectivity on the top mirror 116. In another embodiment, the current spreading layer 136 may impact reflectivity of the top mirror 116.

The top mirror portion 116 may include a high contrast grating mirror 138, a dielectric-enhanced metal mirror 140, or both the high contrast grating mirror 138 and the dielectric-enhanced metal mirror 140 disposed over the current spreading layer 136 to enhance reflectivity of the light within the laser cavity 124. In another example, the top mirror portion 116 may include a conductive metal oxide or nitride layer below the dielectric-enhanced metal mirror 140, above the high contrast grating mirror 138, or between the dielectric-enhanced metal mirror 140 and the high contrast grating mirror 138.

In the example embodiment illustrated in FIGS. 1 and 2, the VCSEL structure 100 includes the high contrast grating mirror 138 disposed on the current spreading layer 136 and the dielectric-enhanced metal mirror 140 disposed on the high contrast grating mirror 138. In another embodiment, the dielectric-enhanced metal mirror 140 may be omitted. In another embodiment, the high contrast grating mirror 138 may be omitted, and the dielectric-enhanced metal mirror 140 may be disposed on the current spreading layer 136. In another embodiment, the reflectivity of the dielectric-enhanced metal mirror 140 may not enhanced by the dielectric layer included therein. The dielectric layer of the dielectric-enhanced metal mirror 140 may be used to prevent metal from diffusing into the underlying semiconductor layers.

The high contrast grating mirror 138 and the dielectric-enhanced metal mirror 140, individually or in combination, may replace a number of semiconductor layers 120, 122 of the pDBR 118 to provide the desired reflectivity characteristics in the VCSEL structure 100. Each of the high contrast grating mirror 138 and the dielectric-enhanced metal mirror 140 is a mirror having high reflectivity and may be used individually in concert with the pDBR 118, or may be used together in concert with the pDBR 118. The use of either the high contrast grating mirror 138 or the dielectric-enhanced metal mirror 140 in combination with the pDBR 118 results in a higher net reflectivity than the reflectivity provided by the exclusive use of the pDBR 118 in the top mirror portion 116. The use of the combination of the high contrast grating mirror 138 and the dielectric-enhanced metal mirror 140 may result in higher reflectivity characteristics than would be provided by the individual use of the high contrast grating mirror 138 or the dielectric-enhanced metal mirror 140 in concert with the pDBR 118.

Generally, in designs to date, a pDBR may include between about twenty-five and thirty-five pairs of semiconductor layers to provide the reflectivity characteristic to lase. According to the present disclosure, the inclusion of the high contrast grating mirror 138, the dielectric-enhanced metal mirror 140, or both the high contrast grating mirror 138 and the dielectric-enhanced metal mirror 140 reduces the number of pairs of the semiconductor layers 120, 122 to provide the reflectivity characteristic to lase. In one or more embodiments of the present disclosure, the reduction in the number of pairs of the semiconductor layers 120, 122 to provide the reflectivity characteristic to lase may be at least a third or more. In one or more embodiments of the present disclosure, the reduction in the number of pairs of the semiconductor layers 120, 122 to provide the reflectivity characteristic to lase may be half or more. In at least one embodiment, the reduction in the number of pairs of the semiconductor layers 120, 122 to provide the reflectivity characteristic to lase may be at least sixty percent. In at least one other embodiment, the reduction in the number of pairs of the semiconductor layers 120, 122 to provide the reflectivity characteristic to lase may be at least seventy percent.

As provided in the example embodiment of FIGS. 1 and 2, the inclusion of both the high contrast grating mirror 138 and the dielectric-enhanced metal mirror 140 provides a seventy percent reduction (a reduction from thirty pairs to nine pairs) in the number of pairs of the semiconductor layers 120, 122 utilized to provide the reflectivity characteristic to lase. Accordingly, the top mirror portion 116 of the present disclosure having a reduced number of layers 120, 122 in the pDBR 118 and additionally including the high contrast grating mirror 138, the dielectric-enhanced metal mirror 140, or both the high contrast grating mirror 138 and the dielectric-enhanced metal mirror 140 may have substantially identical or higher reflectivity characteristics to lase than a conventional pDBR including thirty pairs of semiconductor layers.

The reduction in the number of semiconductor layers 120, 122 in the pDBR 118 results in a reduction in height of the VCSEL structure 100 and a reduction in the number of layers to epitaxially grow, thereby reducing manufacturing costs and complexities. Additionally, the quality of the active layers 128 is improved, as the active layers 128 are epitaxially grown before the top mirror portion 116, and as the growth time is increased, the probability increases that the active layers 128 may degrade due to interdiffusion with the barrier layers 130.

As provided in the example embodiment of FIGS. 1 and 2, the high contrast grating mirror 138 is a reflector and a thin structure (e.g., less than one optical wavelength) and has high reflectivity (e.g., greater than ninety-nine percent). As illustrated in the example embodiment of FIGS. 1 and 2, the high contrast grating mirror 138 may include a plurality of rectangular lines 139 (only one indicated in FIG. 2) linearly disposed in corresponding grooves etched in the current spreading layer 136. Although the lines are illustrated as rectangular-shaped, the present disclosure is not limited thereto, and the lines could include, for example, additional rectangular lines disposed transverse to the illustrated rectangular wavelengths in a 2D array, circular posts arrayed in a 2D array, or circular holes arrayed in a 2D array.

The lines reflect light with a particular polarization. In addition, the wavelength of the light reflected by the high contrast grating mirror 138 may be determined by the line thickness and the duty cycle, which may be calculated by dividing the width of each line by the period of each groove. The high contrast grating mirror 138 reflects TM or TE polarized light depending on the line thickness and duty cycle of the high contrast grating mirror 138. TE polarization corresponds to the electric field component of an incident electromagnetic wave being directed parallel to the lines of the high contrast grating mirror 138, and TM polarization corresponds to the electric field component of an incident electromagnetic wave directed perpendicular to the lines of the high contrast grating mirror 138. A particular line thickness and duty cycle may be suitable for reflecting TE polarized light but not for reflecting TM polarized light, while a different line thickness and duty cycle may be suitable for reflecting TM polarized light but not TE polarized light.

As illustrated in the example embodiment of FIGS. 1 and 2, the dielectric-enhanced metal mirror 140 is a reflector having high reflectivity (e.g., greater than ninety-eight percent) and a thin structure (e.g., less than one optical wavelength). In the example embodiment of FIGS. 1 and 2, the dielectric-enhanced metal mirror 140 is constructed from silicon dioxide and gold. The present disclosure is not limited thereto, and other metals, dielectrics, and transparent conductive oxides and nitrides may be selected based on reflectivity characteristics and the desired wavelength of the coherent light in a manner that will be apparent to those skilled in the art having the benefit of this disclosure.

The VCSEL 100 may include a plurality of layers 142, 144, 145 disposed over the high contrast grating mirror 138, the dielectric-enhanced metal mirror 140, or both the high contrast grating mirror 138 and the dielectric-enhanced metal mirror 140 depending on the configuration of the top mirror portion 116 as disclosed above. As shown in the example embodiment of FIGS. 1 and 2, the plurality of layers 142, 144 includes a trace layer 142 disposed over the dielectric-enhanced metal mirror 140, an insulating layer 144 disposed over the trace layer 142, and a thermal conducting layer 145 disposed between the trace layer 142 and the insulating layer 144. In one or more embodiments, the plurality of layers may also include a conformal capping layer forming a portion of the trace layer or may be patterned independently of the trace layer 142. The plurality of layers 142, 144, 145, including the conformal capping layer in some embodiments, as configured may optically and hermetically seal the laser cavity 124 from an environment external of the bottom-emitting VCSEL structure 100 and efficiently spread and extract heat from the laser cavity 124.

In one or more embodiments, the trace layer 142 may be constructed from a metal or alloy. For example, the trace layer 142 may be constructed from or include gold, platinum, aluminum, copper, tin, nickel, chromium, titanium, and a copper/chromium alloy. In one or more embodiments, the insulating layer 144 may be constructed from a dielectric material. For example, the insulating layer 144 may be constructed from or include silicon oxide. In addition to facilitating the transfer of electrical energy from an external voltage source to the active region 126, the trace layer 142 may further hermetically seal and optically isolate the laser cavity 124 from an environment external to the VCSEL structure 100. In one or more embodiments, the thermal conducting layer 145 may be a metal of high thermal conductivity, such as, for example, silver and copper, or in other embodiments, may be a high thermal conductivity dielectric material, such as diamond thin film.

The VCSEL 100 may include a polyimide layer 146 disposed between the trace layer 142 and the nDBR 110 and surrounding the top mirror portion 116. The polyimide layer 146 may be utilized as a bridge for the trace layer 142 to the top mirror portion 116. The polyimide layer 146 may further be utilized to insulate and isolate the laser cavity 124 from an environment external to the VCSEL structure 100.

The VCSEL 100 may include a plurality of contact rings (two shown 148, 150) to electrically couple the trace layer 142 with the pDBR 118 and the nDBR 110. The plurality of contact rings 148, 150 may include a p-contact ring 148 and an n-contact ring 150. As shown in FIG. 1, the n-contact ring 150 may be disposed on the nDBR 110 to electrically couple the nDBR 110 and the negative terminal (not shown) of the voltage source. The p-contact ring 148 may be disposed on the current spreading layer 136 to electrically couple the pDBR 118 and the positive terminal (not shown) of the voltage source. In one or more embodiments, each of the contact rings 148, 150 may be constructed from gallium arsenide and the n-contact ring 150 may include gold, nickel, germanium, and/or platinum, and the p-contact ring 148 may include titanium, platinum, and/or gold.

The VCSEL 100 may include a plurality of solder bumps 152 (two shown) disposed on the insulating layer 144, the trace layer 142, or both the insulating layer 144 and the trace layer 142 to flip chip and electrically couple the bottom-emitting VCSEL structure 100 to the second substrate (not shown). The solder bumps 152 may be positioned to align with the electrical connections of the second substrate. In one or more embodiments, underfill may be added in the gap (not shown) formed between the VCSEL structure 100 and the second substrate without being optically coupled to the laser cavity 124. This enables more flexibility in the selection of underfill and independent optimization of the underfill, in terms of intrinsic stress and thermal conductivity, for example.

In operation, in the example embodiment of the VCSEL 100 structure illustrated in FIGS. 1 and 2, a current is injected from the voltage source (not shown) to the active layers 128 via the solder bumps 152, the trace layer 142, and the n-contact ring 150, and the light generated by the active layers 128 is allowed to resonate between the nDBR 110 and the top mirror portion 116 including the high contrast grating mirror 138 and the dielectric enhanced metal mirror 140. The VCSEL 100 may operate in a single mode or multi-mode, where one or more wavelengths of coherent light may be emitted through the lens 108 of the substrate 102. For example, in the example embodiment, the wavelength of the emitted coherent light is 1000 nm.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A bottom-emitting vertical-cavity surface-emitting laser (VCSEL) structure comprising:
   a first substrate permitting the passage of light therethrough;
   an n-doped distributed Bragg reflector (nDBR) disposed on the first substrate and including a first plurality of layers of semiconductor material;
   a p-doped distributed Bragg reflector (pDBR) having a second plurality of layers of semiconductor material, the pDBR and the nDBR defining a laser cavity extending vertically therebetween;
   one or more active layers disposed in the laser cavity between the nDBR and the pDBR;
   at least one of a high contrast grating mirror and a dielectric-enhanced metal mirror disposed over the pDBR; and
   a third plurality of layers disposed over the at least one of the high contrast grating mirror and the dielectric-enhanced metal mirror, the third plurality of layers including a trace layer, an insulating layer, and a thermal conductive layer disposed between the trace layer and the insulating layer, each of the third plurality of layers configured to optically and hermetically seal the laser cavity from an environment external of the bottom-emitting VCSEL structure, and the thermal conducting layer further configured to extract heat from the laser cavity,
   wherein the VCSEL structure is configured to be flip chipped to a second substrate.

2. The bottom-emitting VCSEL structure of claim 1, further comprising:
   a current spreading layer disposed on the pDBR; and
   the high contrast grating mirror disposed on the current spreading layer.

3. The bottom-emitting VCSEL structure of claim 2, further comprising the dielectric-enhanced metal mirror disposed on the high contrast grating mirror.

4. The bottom-emitting VCSEL structure of claim 1, further comprising:
   a current spreading layer disposed on the pDBR; and
   the dielectric-enhanced metal mirror disposed on the current spreading layer.

5. The bottom-emitting VCSEL structure of claim 1, wherein the one or more active layers include multiple quantum well (MQW) gain media.

6. The bottom-emitting VCSEL structure of claim 1, wherein the first substrate defines a lens through which the light is permitted to pass.

7. The bottom-emitting VCSEL structure of claim 1, wherein the second plurality of layers of semiconductor material includes pairs of aluminum gallium arsenide (AlGaAs) layers, each pair of AlGaAs layers having a first AlGaAs layer and a second AlGaAs layer, the first AlGaAs layer having a different concentration of aluminum than the second AlGaAs layer, and the first AlGaAs layers and the second AlGaAs layers being arranged in an alternating sequence within the pDBR.

8. The bottom-emitting VCSEL structure of claim 7, wherein the second plurality of layers of semiconductor material includes twenty or fewer pairs of AlGaAs layers.

9. The bottom-emitting VCSEL structure of claim 1, wherein the first plurality of layers of semiconductor material includes pairs of aluminum gallium arsenide (AlGaAs) layers, each pair of AlGaAs layers having a first AlGaAs layer and a second AlGaAs layer, the first AlGaAs layer having a different concentration of aluminum than the second AlGaAs layer, and the first AlGaAs layers and the second AlGaAs layers being arranged in an alternating sequence within the nDBR.

10. The bottom-emitting VCSEL structure of claim 1, further comprising an oxidized layer disposed over the one or more active layers and defining an oxide aperture to contain a current flowing therethrough.

11. A bottom-emitting vertical-cavity surface-emitting laser (VCSEL) structure comprising:
a first substrate permitting the passage of light therethrough;
a first mirror portion disposed on the first substrate and including a first plurality of layers of semiconductor material;
a second mirror portion including a second plurality of layers of semiconductor material, the first mirror portion and the second mirror portion defining a cavity extending vertically therebetween, and the second mirror portion further including
an oxidized layer defining an oxide aperture to contain a current flowing therethrough; and
at least one of a high contrast grating mirror and a dielectric-enhanced metal mirror disposed over the oxidized layer;
an active region disposed within the cavity;
a third plurality of layers disposed over the second mirror portion to optically and hermetically seal the cavity from an environment external of the bottom-emitting VCSEL structure; and
a polyimide layer surrounding the second mirror portion and coupling the one or more layers of the third plurality of layers, the first mirror portion, and the second mirror portion,
wherein the VCSEL structure is configured to be flip chipped to a second substrate.

12. The bottom-emitting VCSEL structure of claim 11, wherein:
the first mirror portion is an n-doped distributed Bragg reflector (nDBR);
the second mirror portion includes a p-doped distributed Bragg reflector (pDBR); and
each of the first plurality of layers and the second plurality of layers includes pairs of aluminum gallium arsenide (AlGaAs) layers, each pair of AlGaAs layers having a first AlGaAs layer and a second AlGaAs layer, the first AlGaAs layer having a different concentration of aluminum than the second AlGaAs layer, and the first AlGaAs layers and the second AlGaAs layers being arranged in an alternating sequence within the nDBR and the pDBR.

13. The bottom-emitting VCSEL structure of claim 11, wherein the active region includes multiple quantum well (MQW) gain media.

14. The bottom-emitting VCSEL structure of claim 11, wherein the second mirror portion further comprises a current spreading layer, and the high contrast grating mirror is disposed on the current spreading layer.

15. The bottom-emitting VCSEL structure of claim 14, further comprising the dielectric-enhanced metal mirror disposed on the high contrast grating mirror.

16. The bottom-emitting VCSEL structure of claim 11, wherein the second mirror portion further comprises a current spreading layer, and the dielectric-enhanced metal mirror is disposed on the current spreading layer.

17. A bottom-emitting vertical-cavity surface-emitting laser (VCSEL) structure comprising:
a first substrate permitting the passage of light therethrough;
an n-doped distributed Bragg reflector (nDBR) disposed on the first substrate and including a first plurality of layers of semiconductor material;
a p-doped distributed Bragg reflector (pDBR) having a second plurality of layers of semiconductor material, the pDBR and the nDBR defining a laser cavity extending vertically therebetween;
one or more active layers disposed in the laser cavity between the nDBR and the pDBR;
an oxidized layer disposed over the one or more active layers and defining an oxide aperture to contain a current flowing therethrough;
a current spreading layer disposed over the pDBR;
at least one of a high contrast grating mirror and a dielectric-enhanced metal mirror disposed over the current spreading layer;
a third plurality of layers disposed over the at least one of the high contrast grating mirror and the dielectric-enhanced metal mirror to optically and hermetically seal the laser cavity from an environment external of the bottom-emitting VCSEL structure;
a plurality of contact rings to electrically couple a trace layer of the third plurality of layers with the pDBR and the nDBR; and
a plurality of solder bumps disposed on each of the trace layer and an insulating layer of the third plurality of layers to flip chip and electrically couple the bottom-emitting VCSEL structure to a second substrate.

18. The bottom-emitting VCSEL structure of claim 17, further comprising the high contrast grating mirror disposed on the current spreading layer.

19. The bottom-emitting VCSEL structure of claim 18, further comprising the dielectric-enhanced metal mirror disposed on the high contrast grating mirror.

20. The bottom-emitting VCSEL structure of claim 17, further comprising the dielectric-enhanced metal mirror disposed on the current spreading layer.

* * * * *